US011740959B2

(12) United States Patent
Xu et al.

(10) Patent No.: US 11,740,959 B2
(45) Date of Patent: Aug. 29, 2023

(54) DYNAMIC VOLTAGE SETTING OPTIMIZATION DURING LIFETIME OF A MEMORY DEVICE

(71) Applicant: MICRON TECHNOLOGY, INC., Boise, ID (US)

(72) Inventors: Zhongguang Xu, San Jose, CA (US); Murong Lang, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 464 days.

(21) Appl. No.: 16/925,215

(22) Filed: Jul. 9, 2020

(65) Prior Publication Data

US 2022/0012121 A1  Jan. 13, 2022

(51) Int. Cl.
*G11C 16/04* (2006.01)
*G06F 11/10* (2006.01)
*G11C 16/10* (2006.01)
*G11C 29/00* (2006.01)

(52) U.S. Cl.
CPC ............ *G06F 11/10* (2013.01); *G11C 16/10* (2013.01); *G11C 29/72* (2013.01)

(58) Field of Classification Search
CPC ....... G11C 16/10; G11C 29/72; G11C 16/349; G11C 29/021; G11C 29/028; G11C 16/26; G11C 11/22
USPC ..................................................... 365/185.09
See application file for complete search history.

(56) References Cited

U.S. PATENT DOCUMENTS 10,318,200 B2 * 6/2019 Lee ..................... G06F 3/0679
10,777,271 B2 * 9/2020 Fang .................. G11C 13/0004

\* cited by examiner

*Primary Examiner* — Tha-O H Bui
(74) *Attorney, Agent, or Firm* — Lowenstein Sandler LLP

(57) ABSTRACT

An initial level of sensing voltage is set based on one or more characteristics of the segment of the memory device. A count for operational cycles for a segment of a memory device is set. Responsive to determining that a number of operational cycles performed on the segment of the memory device has reached the set count of operational cycles, the sensing voltage is varied with respect to the initial level of sensing voltage. The sensing voltage is adjusted to a new level based on wearing of the segment of the memory device during the number of operational cycles performed on the segment of the memory device.

20 Claims, 8 Drawing Sheets

DYNAMIC VOLTAGE SETTING OPTIMIZATION DURING LIFETIME OF A MEMORY DEVICE

TECHNICAL FIELD

Embodiments of the present disclosure relate generally to a memory sub-system, and more specifically, relate to optimizing voltage settings based on variations in wearing condition of a segment of a memory device in the memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1:
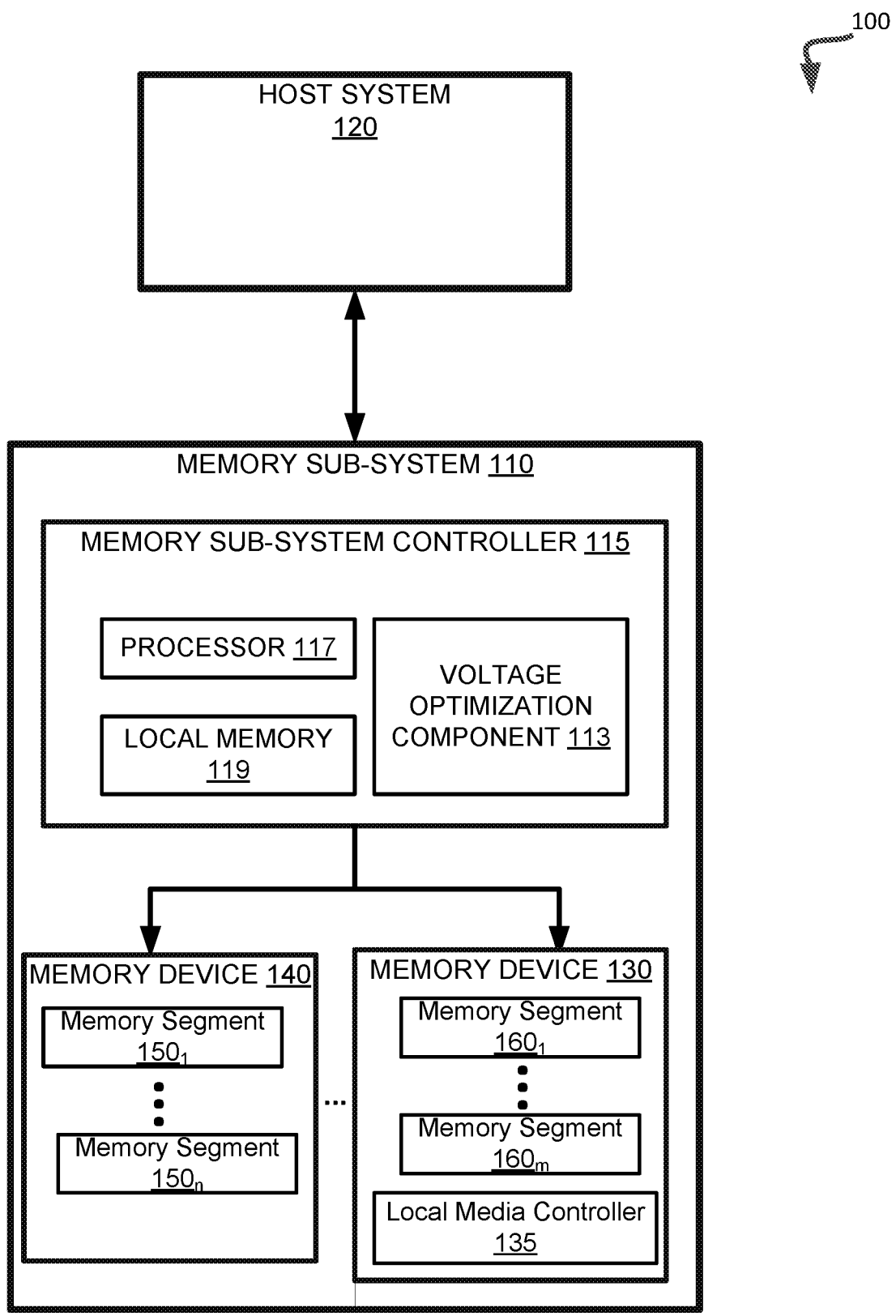
FIG. 1 illustrates an example computing system that includes a host system coupled with a memory sub-system in accordance with some embodiments of the present disclosure.

Aspects of the present disclosure are directed to dynamically optimizing voltage settings for memory cells in various segments of a memory device in the memory sub-system based on variations in wearing condition in the respective segments as well as based on characteristics of the memory cells of the memory segment. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system. The word "segment" is used to encompass a grouping of one or more memory cells in a memory device based on some common characteristics, as will be elaborated below.

A memory sub-system can include high density non-volatile memory devices where retention of data is desired when no power is supplied to the memory device. One example of non-volatile memory devices is a negative-and (NAND) memory device. Another example is a three-dimensional cross-point ("3D cross-point" memory device that includes an array of non-volatile memory cells. A 3D cross-point memory device can perform bit storage based on a change of bulk resistance, in conjunction with a stackable cross-gridded data access array. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or three-dimensional grid. Memory cells are etched onto a silicon wafer in an array of columns (also hereinafter referred to as bitlines (BL)) and rows (also hereinafter referred to as wordlines (WL)). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. A 3D cross-point based memory device may be called a "drive", which has multiple dies layered in multiple "decks." So a "segment" of a 3D cross-point memory device can mean one or more decks, one or more dies, or one or more cells that are not necessarily physically contiguous but have common characteristics, e.g., have same electrical distance (ED) to wordlines (WL) and/or bitlines (BL), as elaborated further below.

In conventional memory sub-systems, the variation in temperature and/or processing drift can negatively impact the reliability of memory devices. For example, excessive temperature used in the heating process during assembly can, over a period of time, cause crystallization of areas of the memory device (e.g., amorphous phase change memory in reset memory cells). This crystallization can decrease resistivity of the memory cells, which, in turn, decreases the threshold voltage of the memory cells. This lowering of threshold voltage can negatively impact reliability as the high voltage levels can cause voltage level instability, resulting in a higher error rate for the memory device during the operating lifetime of the memory sub-system.

For example, during the operating life of a memory device, the set state and reset state for a memory cell can register higher than expected voltage levels with respect to a predefined threshold voltage ($V_t$) read level. As such, a memory cell of a memory device that should be in a state indicative of a set state (e.g., a lower voltage level associated with a bit value of '1'), could be interpreted by a read operation as a higher voltage level that could be indicative of a reset state (e.g., a higher voltage level associated with a bit value of '0'). This, in turn, can result in a higher error rate due to the drift in observed voltage levels that can impact the representative voltage state of the affected memory cells. While a write operation is performed to program a memory cell to a set state, the voltage state of the memory cell could indicate differently in response to a read operation as a result of the voltage level drift.

Conventional memory sub-systems that are configured in this manner typically address the resulting reliability issues by performing repetitive cycles of specialized read or write operations on the memory device to stabilize the voltage levels of the memory cells. During these "seasoning" cycles, voltage pulses are applied to the memory device to stabilize the voltage levels of the memory cells to predetermined set and reset voltage states separated by a demarcation voltage (Vdm), which is also referred to as "sensing voltage" during the operational lifetime of the memory device.

In conventional memory sub-systems, the same number of seasoning cycles are applied to all memory devices of the memory sub-system to obtain an initial level of sensing voltage at the beginning of the operational lifetime of the memory device. In such instances, some memory devices can reach stable voltage levels with fewer seasoning cycles, while some memory devices can reach stable voltage levels with more seasoning cycles. Applying a single number of seasoning cycles, therefore, can "over-season" or "under-season" various memory devices within the memory sub-system. Over-seasoning can significantly reduce the lifespan of that memory device because of excessive wearing even before the operational lifetime for the memory device starts. Conversely, under-seasoning a memory device can result in higher bit error rates due to the continued instability of the voltage levels during the operational lifetime of the memory device.

Aspects of the present disclosure address the above and other deficiencies choosing different sensing voltage levels for different segments of a memory device based on characteristics of the memory cells in the respective segment of the memory device as well based on a current level of wearing in the segment during the segment's operational lifetime. The characteristics of the memory cells in a particular segment of a memory device dictate an initial bit error rate for the respective segment. After a preset number of operational cycles (e.g., a read cycle or a write cycle), if the determined bit error rate does not satisfy the acceptable bit error rate associated with stabilized voltage levels, the sensing voltage is adjusted before moving on to the next set of operational cycles. The read cycle constitutes transferring data from a memory device to a host. A write cycle constitutes transferring data from the host to the memory device. The dynamic voltage optimization scheme disclosed herein can adapt to the current wearing conditions due to the number of operational cycles as well as other characteristics of the media at a more granular level than an entire memory device level (also known as the drive level).

Advantages of the present disclosure include, but are not limited to, improved reliability of a memory device during its operating lifetime, which leads to superior data integrity. The dynamic voltage optimization process of the present disclosure reduces the impact of reliability and performance variation between various segments of a memory device due to external factors, such as temperature experienced by the segment, location of a the segment in the memory device (e.g., which deck of a memory device the segment belongs to) etc.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such. Memory device 130 may have a plurality of memory segments $150_i$(i=1, 2, . . . , n) therein, and memory device 140 may have a plurality of memory segments $160_i$(i=1, 2, . . . , m) therein, where 'i', 'n' and 'm' are integers. Number of memory segments does not have to be equal in all memory devices.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA) namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can additionally include a voltage optimization component 113 that can be used to facilitate the operations for the memory devices 130. The operations include transferring data from a host to the memory device during the write cycles, and transferring data from the memory device to the host for the read cycles. In some embodiments, the memory sub-system controller 115 includes at least a portion of voltage optimization component 113. For example, the memory sub-system controller 115 can include a processor 117 (processing device) configured to execute instructions stored in local memory 119 for performing the operations described herein. In some embodiments, voltage optimization component 113 is part of the host system 110, an application, or an operating system. In other embodiment, local media controller 135 includes at least a portion of voltage optimization component 113 and is configured to perform the functionality described herein. Further details with regards to the operations of the voltage optimization component 113 are described below.

Figure 2:
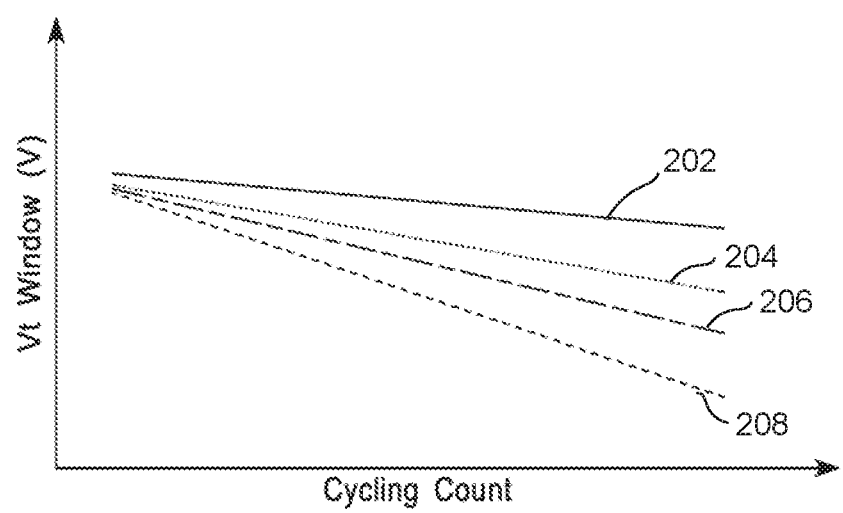
FIG. 2 illustrates variation of threshold voltage window with cycling count for various segments of a memory device subjected to various temperature, in accordance with some embodiments of the present disclosure.

FIG. 2 illustrates variation of threshold voltage window with cycling counts for various segments of a memory device subjected to various temperature conditions, in accordance with some embodiments of the present disclosure. In general the threshold voltage window (i.e. the difference between a maximum value of threshold voltage and a minimum value of threshold voltage before the bit error rates become unacceptable) degrades as the operational cycle count increases. This degradation becomes more prominent for a memory segment that experiences high temperature (plot 208) compared to the same memory segment experiencing a low temperature (plot 204). At room temperature, the degradation of threshold voltage window is in between the degradation seen at a high temperature and degradation seen at a low temperature, as shown by the plot 206. FIG. 2 further illustrates that for the same temperature, the degradation of the threshold voltage window can depend on a physical location of the memory segment in the memory device. For example, the degradation for a first segment ("deck0") at room temperature (plot 202) is less prominent than the degradation for a second segment ("deck1") at room temperature (plot 206). An initial level of sensing voltage for a particular segment is chosen based on these "pre-conditions" that the cells of the memory segment has been subjected to before its operational lifetime. Another characteristics that can be factored in for setting the initial sensing voltage is variation in electrical distance (ED), i.e., the distance from a voltage source to the memory cells in a memory array. The voltage source in the memory array are the wordline (WL) and bitline (BL) drivers. The further the memory cells are from the drivers, the larger the voltage drop between the expected voltage and actual voltage, which can impact characteristics of the memory devices or segments thereof. ED can have large impact on the reliability of the memory device. Lower write voltages can cause certain memory cells in the memory device to have different threshold voltage distribution compared to memory cells programmed with higher write voltages.

Figure 3A:
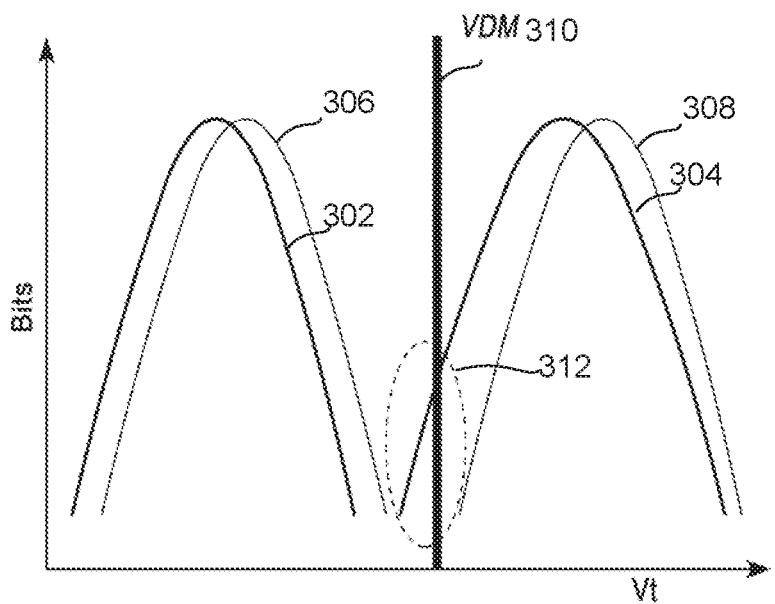
FIG. 3A illustrates a single sensing voltage for various segments of a memory device for a fixed number of operational cycles, in accordance with some embodiments of the present disclosure.

FIG. 3A illustrates a single sensing voltage (Vdm 310) applied for two segments of a memory device. The curve 302 illustrates the threshold voltage distribution for a "set" stage for a first memory segment, and the curve 304 illustrates the threshold voltage distribution for a "reset" stage for the same memory segment. Initial sensing voltage (Vdm 310) is set to demarcate the set and reset stages for the first memory segment for a fixed number of cycles. However, for the same number of cycles, that single Vdm 310 may not clearly demarcate the set (curve 306) and reset (curve 308) stages for a second memory segment. The bits for the second memory segment within the outline 312 are likely to be read as erroneous values because of the sub-optimal Vdm 310 for the second memory segment.

Figure 3B:
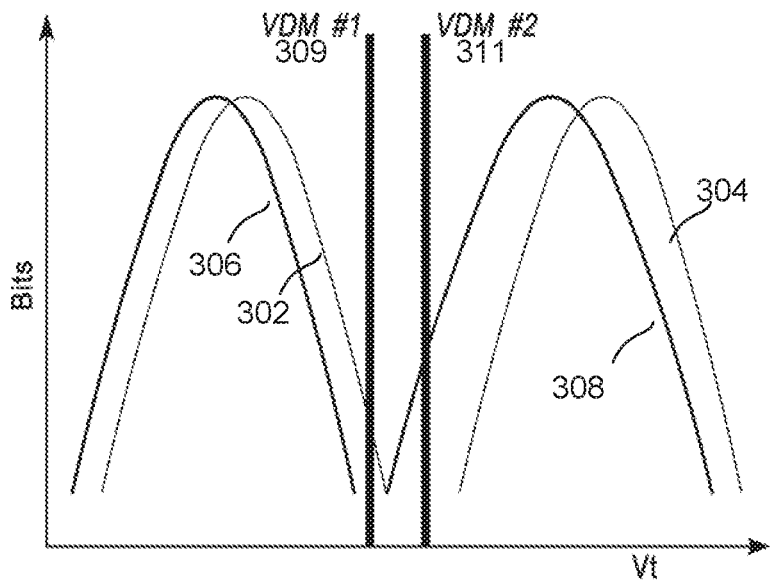
FIG. 3B illustrates different sensing voltages for different segments of a memory device for a fixed number of operational cycles, in accordance with an embodiment of the present disclosure.

FIG. 3B illustrates different sensing voltages (Vdm #1 311 and Vdm #2 309) applied for different segments of a memory device for a fixed number of operational cycles, in accordance with an embodiment of the present disclosure. Vdm #2 309 can be optimized for the set (curve 302) and reset (304) demarcation for a first segment of a memory device, while Vdm #1 311 can be optimized for the set (curve 306) and reset (curve 308) demarcation for a second segment of the memory device after the two segments have been subjected to the same or different numbers of operational cycles. This results in shifting the set and reset curves slightly for each segment, needing the initial sensing voltage Vdm 310 shown in FIG. 3A to be shifted by an offset voltage, as described below.

Figure 4:
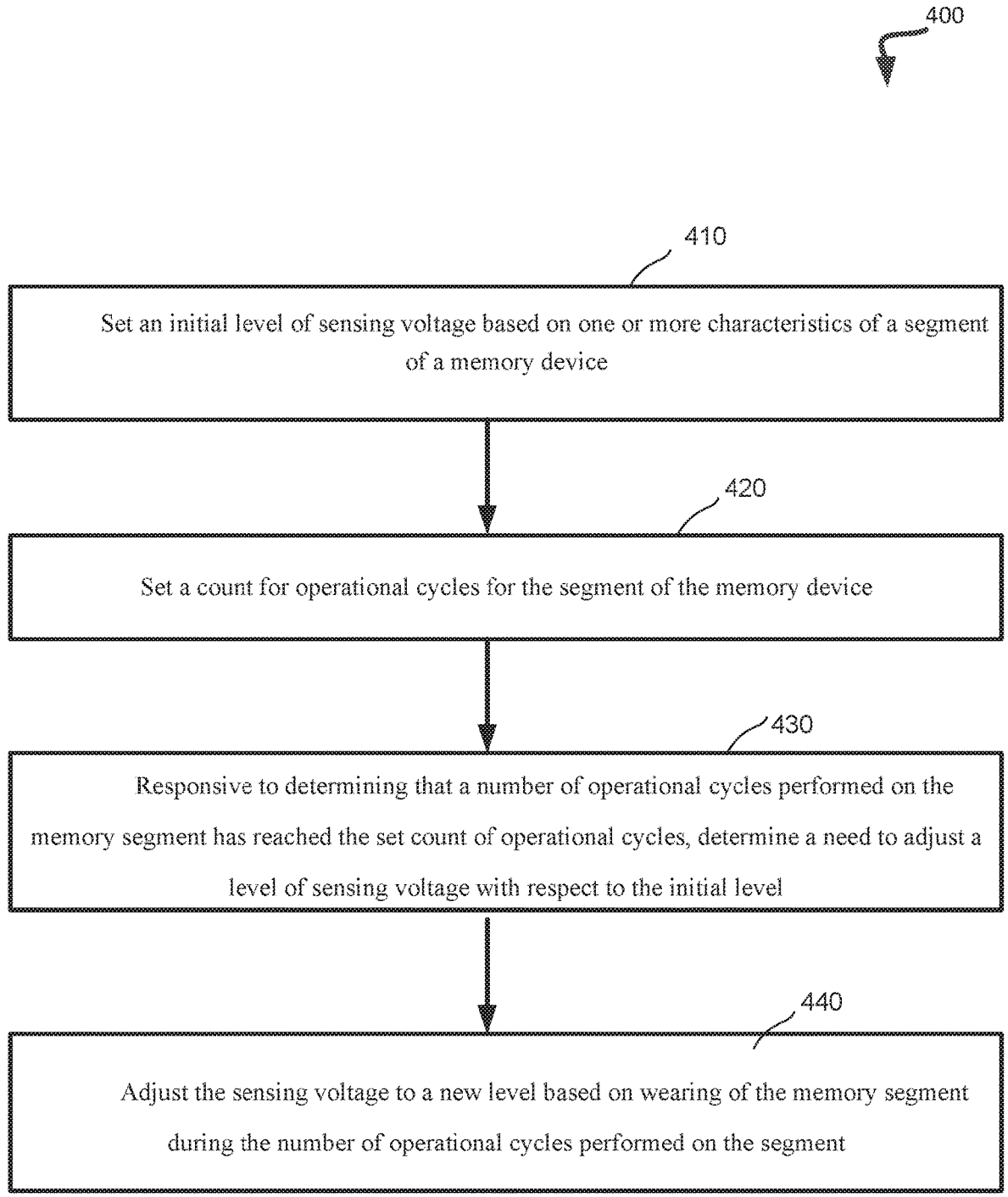
FIG. 4 illustrates a flow diagram of an example method of dynamic voltage optimization, in accordance with some embodiments of the present disclosure.

FIG. 4 is a flow diagram of an example method 400 of dynamically optimizing sensing voltage in a memory segment, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 can be performed by voltage optimization component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments.

Thus, not all processes are required in every embodiment. Other process flows are possible.

At operation 410, the voltage optimizer component 113 sets an initial level of sensing voltage based on one or more characteristics of a segment of the memory device. This process is sometimes referred to as voltage "trimming", where one or more parameters for read cycling or write cycling the particular segment are locally stored in the segment. Some of the trimming parameters can include parameters of the initial sensing voltage level, such as, pulse width, amplitude and rate. Trimming parameters, including the initial level of sensing voltage, can vary from one segment to another segment in a memory device.

At operation 420, a processing device in the voltage optimizer component 113 or elsewhere in the memory sub-system controller 115 sets a count for operational cycles for the segment of a memory device. A "count" sets a threshold number of operational cycles after which the sensing voltage is adjusted. This count can also vary from one segment to another segment. Typical values of operational cycles can be 50k, 100k, 150, 200k, 500k, 1 million etc. based on the expected performance of the memory device which the segment belongs to. As an example, a memory device can be designed for a total of 200k operational cycles during its lifetime. So an initial count can be set to 50k, and then incremented by another 50k after the processing device adjusts the sensing voltage according to the operations 430 and 440 described below, until the total cycle count reaches 200k. Note that these illustrative numbers are non-limiting, and any other number of operational cycles can be used.

At operation 430, responsive to determining that a number of operational cycles performed on the segment of the memory device has reached the set count of operational cycles, the processing device determines a need to adjust the sensing voltage with respect to the initial level of sensing voltage. To vary the Vdm, a number of Vdm offsets with respect to the initial level of the Vdm can be stored in the memory segment based on location of the memory segment in the memory device and/or other characteristics of the memory segment. Different offset values can be stored for different number of cycle counts. For example, a Vdm offset (0,0,1) can indicate an offset to be applied with respect to the initial sensing voltage after a cycle count reaches a first set point (e.g., N number of cycles) for a first memory segment (e.g., deck0) with a first ED value (e.g., ED0). A Vdm offset (0,0,2) can indicate an offset to be applied with respect to the initial sensing voltage after a cycle count reaches a second set point (e.g., 2N number of cycles) for a first memory segment (e.g., deck0) with a first ED value (e.g., ED0). In the same manner, a Vdm offset (i,m,n) can indicate an offset to be applied with respect to the initial sensing voltage after a cycle count reaches the 'n-th' set point (i.e., n×N number of cycles) for the i-th memory segment (i.e., deck-i) with an m-th ED value (i.e., ED-m). The searching operation is described in greater detail with respect to the flowchart in FIG. 5.

At operation 440, the voltage optimizer component 113 adjusts the sensing voltage to a new level based on wearing of the segment of the memory device during the number of operational cycles performed on the segment of the memory device. As an example, if a cycle count is set to 50k, and the number of read/write operations reaches 50k, then the initial Vdm is offset by the stored offset value in the memory segment to the new level of sensing voltage for a current wearing state corresponding to 50k cycles for the location (e.g., deck0 or deck1) and other characteristics (e.g., ED1, ED2, . . . ED-m) of the memory segment.

Figure 5:
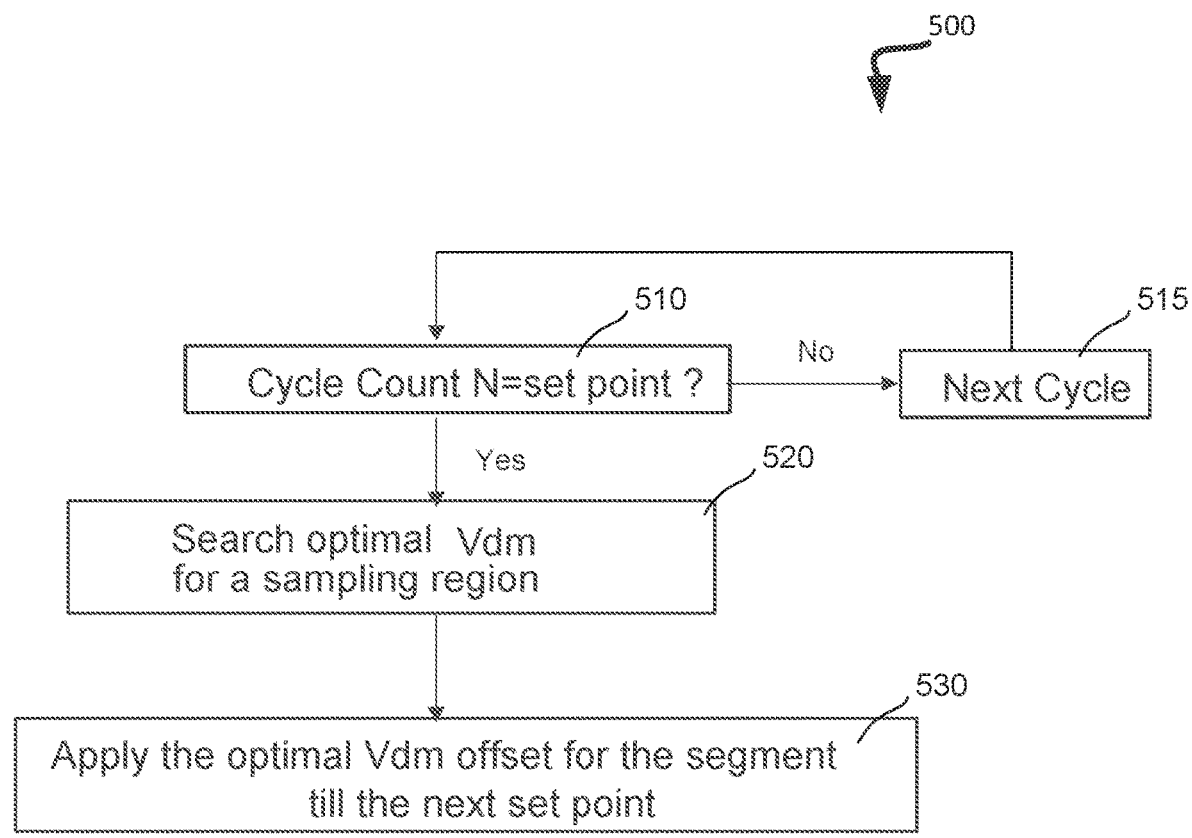
FIG. 5 illustrates a flow diagram of an example method of optimal voltage searching, in accordance with some embodiments of the present disclosure.

FIG. 5 is a flow diagram of an example method 500 of optimum sensing voltage searching, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 can be performed by a processing device in firmware of the memory sub-system coupled to the voltage optimization component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible. This operation can be periodically performed for each memory segment in a memory device.

At operation 510, a processing device sets a cycle count to have a predetermined value, e.g., N. Different values of N can be chosen for different segments, and N can be a cycle threshold criterion specific to a respective memory segment. Until N number of operational cycles are performed on a particular memory segment, an initial Vdm remains unchanged for the memory segment for all the cycles (operation 515). When the cycle count reaches the set point 'N', the process moves to operation 520.

At operation 520, the processing device runs an optimal Vdm search algorithm. In one embodiment, this algorithm can be programmed as a background process to be run by firmware of the memory controller. Selection of sampling region is described in greater detail with respect to FIG. 8. The Vdm search algorithms can be based on determining a bit error rate associated with the memory segment. When the bit error rate satisfies an error threshold criterion specific to the memory segment, the need for adjusting the Vdm is established. The algorithm then searches the optimum stored value of the Vdm offset, as described in operation 430 of method 400.

At operation 530, the processing device applies an optimal Vdm offset to the current value of Vdm to raise or lower the Vdm level to a new adjusted value. That value is maintained till the next set point. The set point can be incremented to 2N or any arbitrary number of additional cycles to be performed on the memory segment, and the operations 520 and 530 are repeated until the new set point is reached.

Figure 6:
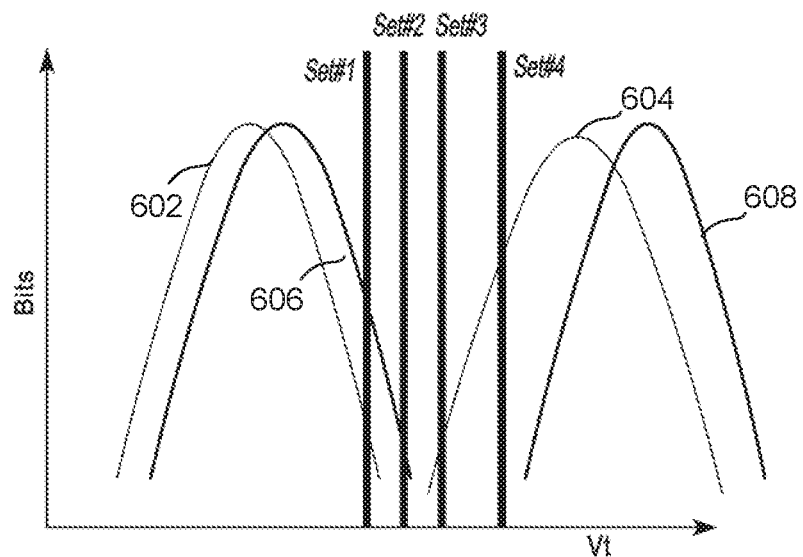
FIG. 6 illustrates various possible voltage offset settings for two different write-to-read delay values, in accordance with some embodiments of the present disclosure.

FIG. 6 illustrates various possible default voltage settings (i.e. initial setting of Vdm during trim optimization) for two different write-to-read delay values at a die-level, in accordance with some embodiments of the present disclosure. Since the separation between a set and reset curve for the same segment with same inherent characteristics can vary based on a write-to-read (W2r) delay time at the die level, the default Vdm can also be adjusted based on the write-to-read delay. In FIG. 6, curves 602 and 604 indicate the set and reset curves respectively for a write-to-read delay value of 25 µs, while curves 606 and 608 indicate the set and reset curves respectively for a write-to-read delay value of 1sec. As can be seen from FIG. 6, the greater the write-to-read delay, the greater the separation between set and reset curves. For the same memory device, when the W2r varies, then a different default Vdm can be needed for die-level adjustment. Typically multiple possible Vdm values (for examples, 3-5 different Vdm values) are stored for each memory segment. For example, in the FIG. 6, four possible voltage settings (set #1, set #2, set #3 and set #4) are considered for a first die at deck0 with ED0.

Figure 7:
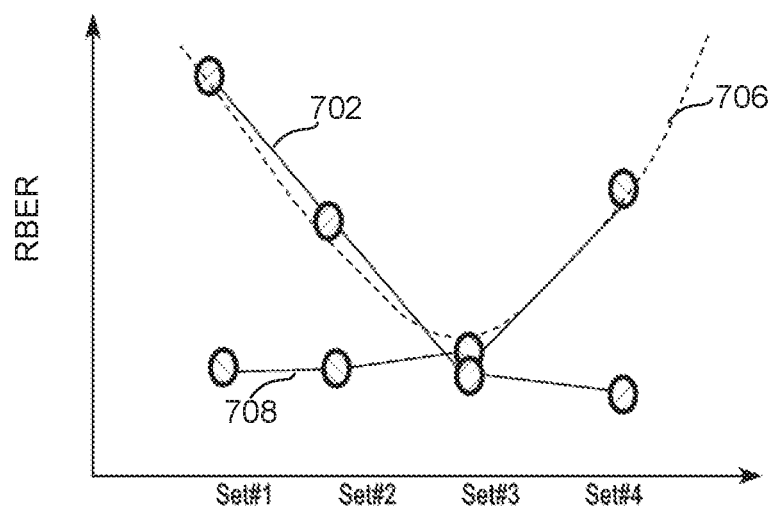
FIG. 7 graphically illustrates choosing a correct voltage setting optimized for varying write-to-read delay values, in accordance with some embodiments of the present disclosure.

FIG. 7 graphically illustrates choosing a correct voltage setting optimized for varying write-to-read delay values, in accordance with some embodiments of the present disclosure. For each possible voltage setting (set #1, set #2, set #3 and set #4) for a particular die, the raw bit error rate (RBER) is plotted. The plot 702 corresponds to a W2r delay value of 1 s, while the plot 704 corresponds to a W2r delay value of 25 µs. While both the plots 702 and 704 deviates from the ideal variation of RBER with continuously varying Vdm, as shown with the curve 706, it can be seen in FIG. 7 that for Vdm setting #3, the RBER is acceptable for both W2r delay times of 25 μs and 1 sec. So the Vdm setting #3 is chosen as the default for the particular memory segment. Note that bit error rate can be indicated by raw bit error rate or failed bit count (FBC).

Figure 8:
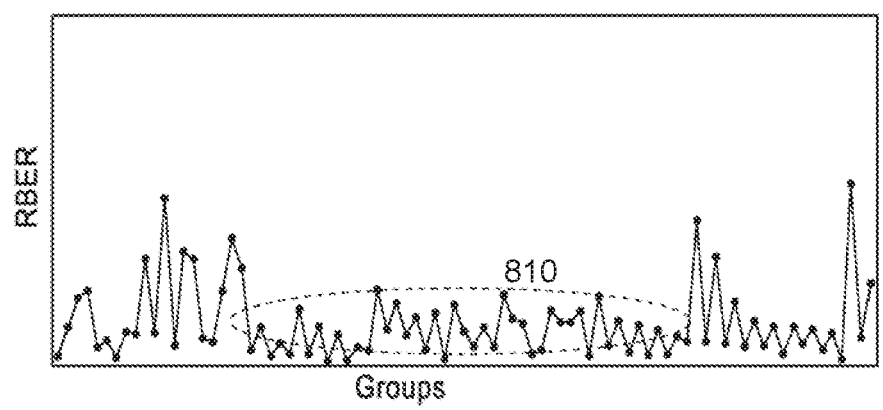
FIG. 8 illustrates a plot showing bit error rate distribution in a sampling region of a memory segment, in accordance with some embodiments of the present disclosure.

FIG. 8 illustrates a plot showing bit error rate distribution in a sampling region of a memory segment, in accordance with some embodiments of the present disclosure. For each memory segment, multiple memory cells with similar RBER values can be grouped together to apply a single Vdm. The memory cells with similar RBER do not have to be physically on the same die and can be distributed across multiple dice. For example, in FIG. 8, RBER from groups of cells are obtained for super-management units (SMUs) of a 3D cross-point memory device, and a typical RBER value from within the outline 810 is chosen as an acceptable RBER value to select a corresponding default Vdm for a particular memory segment. This default Vdm can be dynamically adjusted by the right amount of offset (as described above with respect to flowchart 400) during the lifetime of the memory segment when operational cycles are performed on the memory segment.

Figure 9:
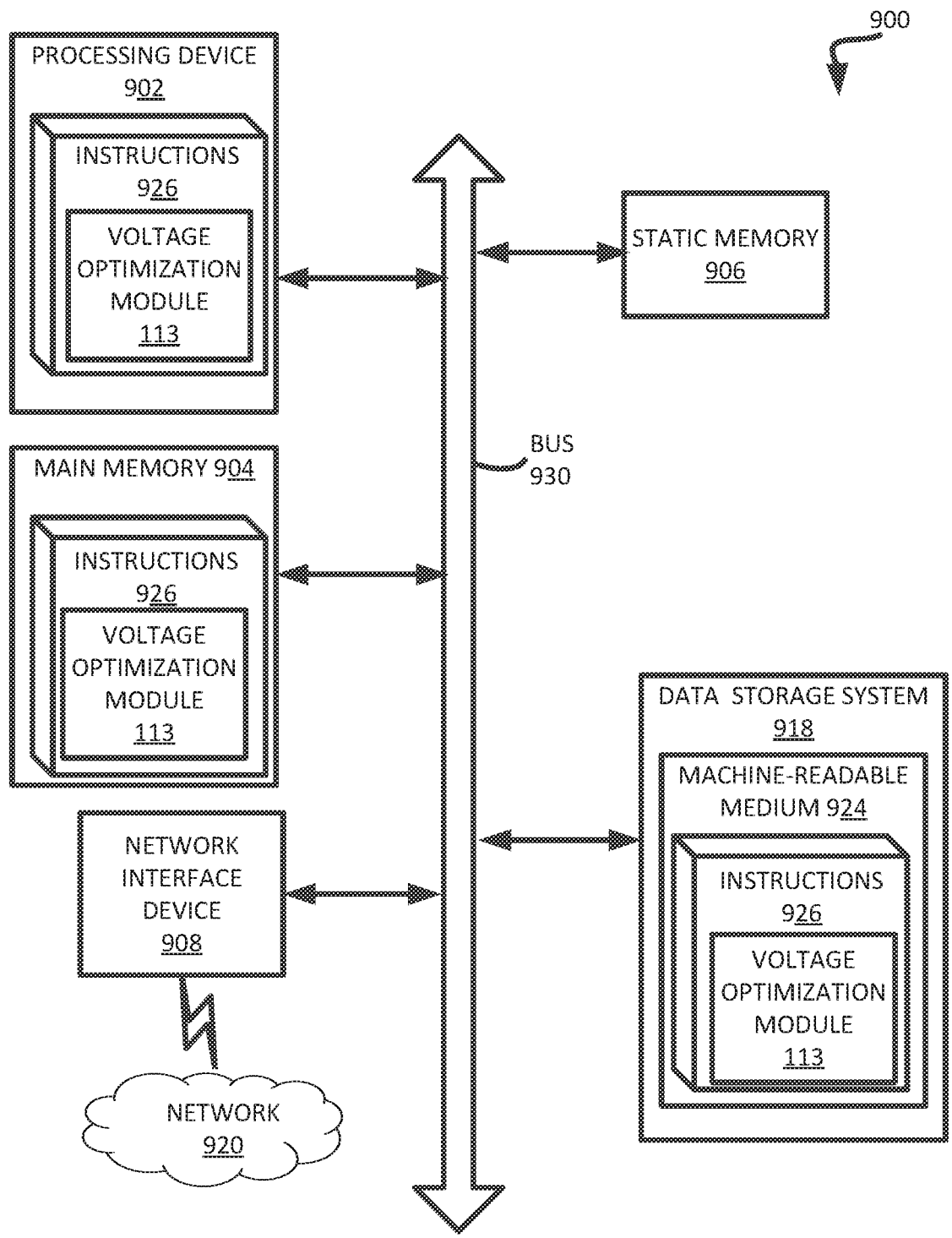
FIG. 9 illustrates a block diagram of an example computer system in which implementations of the present disclosure can operate.

FIG. 9 illustrates an example machine of a computer system 900 within which a set of instructions, for causing the machine to perform any one or more of the methodologies discussed herein, can be executed. For example, the computer system 900 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the voltage optimization component 113 of FIG. 1). In alternative implementations, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage device 918, which communicate with each other via a bus 930.

Processing device 902 represents one or more general-purpose processing devices such as a microprocessor, a central processing unit, or the like. More particularly, the processing device can be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920. The data storage device 918 can include a machine-readable storage medium 924 (also known as a computer-readable medium) on which is stored one or more sets of instructions or software 926 embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage device 918, and/or main memory 904 can correspond to the memory sub-system 110 of FIG. 1.

In one implementation, the instructions 926 include instructions to implement functionality corresponding to a specific component (e.g., voltage optimization component 113 of FIG. 1). While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving" or "servicing" or "issuing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus can be specially constructed for the intended purposes, or it can comprise a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications can be made thereto without departing from the broader spirit and scope of implementations of the disclosure as set forth in the following claims. The specification and drawings are, accordingly, to be regarded in an illustrative sense rather than a restrictive sense.

What is claimed is:

1. A method, comprising:
    setting an initial level of sensing voltage based on one or more characteristics of a segment of a memory device, wherein at least one of the one or more characteristics is attained during fabrication of the segment;
    setting a count for operational cycles for the segment of the memory device;
    responsive to determining, by a processing device, that a number of operational cycles performed on the segment of the memory device has reached the set count of operational cycles, determining a need to adjust the sensing voltage with respect to the initial level of sensing voltage; and
    adjusting the sensing voltage to a new level based on wearing of the segment of the memory device during the number of operational cycles performed on the segment of the memory device.

2. The method of claim 1, wherein the one or more characteristics of the segment of the memory device comprise at least one of a physical location of the segment in the memory device, an electrical distance (ED), a temperature, or a processing drift during fabrication.

3. The method of claim 1, further comprising:
    associating a threshold value of bit error rate with the segment of the memory device.

4. The method of claim 3, wherein the adjusting the sensing voltage further comprises:
    determining a change in the value of the bit error rate for the segment of the memory device associated with the wearing of the segment of the memory device;
    determining a voltage offset required to bring the value of the bit error rate back to the threshold value associated with the segment of the memory device; and
    applying the determined voltage offset to the initial level of sensing voltage to set the sensing voltage to the new level.

5. The method of claim 4, further comprising:
    varying write-to-read delay time for the operational cycle;
    for each write-to-read delay time, storing a plurality of levels of sensing voltage, each of the plurality of levels being at an offset with respect to the initial level of sensing voltage; and
    selecting the new level of sensing voltage from the plurality of levels.

6. The method of claim 1, further comprising:
    re-setting the count of operational cycles to a higher value until a maximum number of operational cycles for a lifetime of the segment of the memory device is reached.

7. The method of claim 1, wherein the method is performed by a background processing thread.

8. A system comprising:
    a memory device comprising a plurality of memory segments; and
    a processing device, operatively coupled to the plurality of memory segments, to periodically perform dynamic voltage optimization operations for each of the plurality of memory segments, the operations comprising:
        determining whether a number of operational cycles performed on a memory segment satisfies a cycle threshold criterion specific to the memory segment;
        responsive to determining that the number of operational cycles satisfies the cycle threshold criterion, determining a bit error rate associated with the memory segment;
        determining whether the bit error rate satisfies an error threshold criterion specific to the memory segment; and
        responsive to determining that the bit error rate satisfies the error threshold criterion, adjusting a level of a sensing voltage applied to the memory segment, wherein a default level of the sensing voltage depends on one or more characteristics of the memory segment, wherein at least one of the one or more characteristics is attained during fabrication of the segment.

9. The system of claim 8, wherein the one or more characteristics of the memory segment comprises at least one of a physical location of the memory segment in the memory device, an electrical distance (ED), a temperature, or a processing drift during fabrication.

10. The system of claim 8, the dynamic voltage optimization operations further comprising:
    associating an applicable value of bit error rate with the memory segment.

11. The system of claim 10, wherein the operation for adjusting the sensing voltage further comprises:

determining a change in the value of the bit error rate for the memory segment associated with wearing of the memory segment;

determining a voltage offset required to bring the value of the bit error rate to a value that satisfies the error threshold criterion associated with the memory segment; and applying the determined voltage offset to an initial level of sensing voltage to set the sensing voltage to a new level.

12. The system of claim 11, the dynamic voltage optimization operations further comprising:

varying write-to-read delay time for the operational cycles;

for each write-to-read delay time, storing a plurality of levels of sensing voltage, each of the plurality of levels being at an offset with respect to an initial level of sensing voltage; and selecting the new level of sensing voltage from the stored plurality of levels.

13. The system of claim 8, the dynamic voltage optimization operations further comprising:

re-setting the cycle threshold criterion to a higher value until a maximum number of operational cycles for a lifetime of the memory segment is reached.

14. The system of claim 8, wherein the bit error rate is represented by at least one of a Raw Bit Error Rate (RBER) or a Failed Bit Count (FBC).

15. The system of claim 8, further comprising firmware that samples the memory device to determine the error threshold criterion to associate with a memory segment.

16. A non-transitory computer readable medium comprising instructions, which when executed by a processing device, cause the processing device to perform operations comprising:

setting an initial level of sensing voltage based on one or more characteristics of a segment of a memory device, wherein at least one of the one or more characteristics is attained during fabrication of the segment;

setting a count for operational cycles for the segment of the memory device;

responsive to determining, by the processing device, that a number of operational cycles performed on the segment of the memory device has reached the set count of operational cycles, determining a need to adjust the sensing voltage with respect to the initial level of sensing voltage; and adjusting the sensing voltage to a new level based on wearing of the segment of the memory device during the number of operational cycles performed on the segment of the memory device.

17. The non-transitory computer readable medium of claim 16, wherein the one or more characteristics of the segment of the memory device comprise at least one of a physical location of the segment in the memory device, an electrical distance (ED), a temperature, or a processing drift during fabrication.

18. The non-transitory computer readable medium of claim 16, the operations further comprising:

associating a threshold value of bit error rate with the segment of the memory device.

19. The non-transitory computer readable medium of claim 18, wherein the adjusting the sensing voltage further comprises:

determining a change in the value of the bit error rate for the segment of the memory device associated with wearing of the segment of the memory device;

determining a voltage offset required to bring the value of the bit error rate back to the threshold value associated with the segment of the memory device; and applying the determined voltage offset to the initial level of sensing voltage to set the sensing voltage to the new level.

20. The non-transitory computer readable medium of claim 19, the operations further comprising:

varying write-to-read delay time for the operational cycle;

for each write-to-read delay time, storing a plurality of levels of sensing voltage, each of the plurality of levels being at an offset with respect to the initial level of sensing voltage; and selecting the new level of sensing voltage from the plurality of levels.

* * * * *